United States Patent [19]

Heiart et al.

[11] Patent Number: 4,508,802

[45] Date of Patent: Apr. 2, 1985

[54] MULTIPLE REGISTRATION AND IMAGING PROCESS TO FORM A SET OF REGISTERED IMAGED ELEMENTS

[75] Inventors: Robert B. Heiart, Middletown; Abraham B. Cohen, Springfield, both of N.J.

[73] Assignee: E. I. Du Pont de Nemours and Company, Wilmington, Del.

[21] Appl. No.: 387,537

[22] Filed: Jun. 11, 1982

[51] Int. Cl.³ ............................................... G03F 9/00
[52] U.S. Cl. ...................................... 430/22; 430/322; 430/327; 430/396
[58] Field of Search ................. 430/22, 291, 322, 325, 430/326, 327, 396

[56] References Cited

U.S. PATENT DOCUMENTS

| | | | |
|---|---|---|---|
| 2,718,181 | 9/1955 | Gullixson et al. | 355/92 |
| 3,547,730 | 12/1970 | Cohen et al. | 156/345 |
| 3,573,975 | 4/1971 | Dhaka et al. | 430/22 |
| 3,877,808 | 4/1975 | Jasperson, Jr. | 355/18 |
| 4,201,581 | 5/1980 | Thomas et al. | 430/396 |
| 4,281,922 | 8/1981 | Matsumoto | 355/99 |
| 4,334,009 | 6/1982 | Charles et al. | 430/291 |

FOREIGN PATENT DOCUMENTS 48-29727 9/1973 Japan.
54-69076 2/1979 Japan.

OTHER PUBLICATIONS

Tokyo Ohka Kogyo Co., Ltd., YN 2000, Sep. 1981, Japan.

*Primary Examiner*—John E. Kittle
*Assistant Examiner*—José G. Dees

[57] ABSTRACT

Method for registering and imagewise exposing to actinic radiation a sequence of sheet substrates which are registerable to one another to produce a composite image.

A liquid layer separates the photomask and photosensitive layer of the substrate during the exposure.

18 Claims, 2 Drawing Figures

MULTIPLE REGISTRATION AND IMAGING PROCESS TO FORM A SET OF REGISTERED IMAGED ELEMENTS

BACKGROUND OF THE INVENTION

There is a continuing need in the graphic arts and related industries to transfer images photographically from original (positive or negative) photomasks to light sensitive sheet elements to form a set of imaged elements which can be combined in register to produce a composite image. The set of imaged elements may be combined directly as for instance in the formation of an overlay picture from registered superposition of individual transparencies, or the use of the set of imaged elements may require further process steps as for instance the formation of a multicolored printed image using a set of individual photopolymer printing plates. In either case, each imaged element of a set must be provided with a common means of registration by which a final composite image can be prepared by aligning or registering precisely the locations previously established on each imaged element of the set. In all cases, the photographic operation is carried out in a manner which maintains, to the greatest precision possible, both the definition and the relative locations of the features of the images.

Composite images formed by simple assembly of the imaged elements in register are typified by the preparation of multicolor overlays and particularly four-color overlay proofs. Such processes are disclosed in U.S. Pat. Nos. 3,060,024; 4,282,308; and 4,229,520. In the processes described, each of four photopolymerizable elements comprising a photopolymer layer and a transparent support is imagewise exposed to a photomask representing each of the four colors to be used, e.g., black, yellow, magenta and cyan. Either the imaging exposure produces registration marks on the photopolymer element or both the photomask and the photohardenable element contain at least two contact points, usually precisely punched holes. After imaging exposure the elements are then processed to produce a set of imaged elements each having a different uniform color but all having the same registration marks or points. By superposing the four elements and aligning the marks or points, a full color rendition of the original picture is formed.

Composite images formed by sequential transfer in register of images from a set of imaged photosensitive elements to a receptor sheet is typified by full color printing using relief printing, planographic printing, and intaglio printing, or by formation of four color proofs by a transfer process similar to that described in U.S. Pat. Nos. 3,060,024 and 3,582,327. The fundamentals of full color printing are described in "The Printing Industry" by Victor Strauss; Printing Industries of America Inc. 1967, and photopolymer elements for preparing printing plates are described in U.S. Pat. Nos. 2,760,863; 2,791,504; 2,964,401; 3,458,311; 4,072,527, 4,072,528; 3,829,204; 4,323,637 and 4,177,074.

Contact printing is virtually the universal method of exposure used today in the previously described photoduplication processes despite certain known shortcomings. Although low in equipment costs, simple to use, and capable of excellent line and halftone definition, contact printing is labor intensive and slow (because of long conditioning and/or vacuum draw-down times). It also is subject to losses due to damaged or dirty photomasks resulting from repeated use. This, in turn, requires frequent and expensive touch up and replacement of photomasks to avoid yield penalties. Much time is also lost in the constant and tedious process of inspecting photomasks for detects between exposure. In addition, variations in frame temperature and ambient humidity affect corner-to-corner registration, especially for large elements such as printing plate.

Alternative exposure methods such as gap printing, projection printing and laser scanning each offer some significant advantages over contact printing. However in the current state of development, all have serious limitations for high productivity applications and are intrinsically much higher in equipment cost.

SUMMARY OF THE INVENTION

The present invention is directed to a process of registering and imagewise exposing to actinic radiation a set of sheet substrates registratable to one another to produce a composite image, each substrate containing a photosensitive layer comprising the steps of:

(1) advancing a substrate to a position in a device to undertake in either order or concurrently
   (a) aligning the substrate and a photomask in a predetermined relationship to one another;
   (b) applying a liquid between the photosensitive layer and the photomask;

(2) contacting through the liquid the substrate containing the photosensitive layer and the photomask whereby during said contacting substantially no movement of the photosensitive layer relative to the photomask occurs on the liquid layer other than a more intimate contact due to displacement of the liquid from a liquid layer during said contact and whereby at least one of interfacial or viscous force due to the liquid layer aids to maintain the photosensitive layer and photomask in a fixed position relative to one another;

(3) exposing the photosensitive layer to actinic radiation through the photomask;

(4) removing the photomask from the exposed photosensitive layer and removing the exposed substrate from the device;

(5) repeating steps 1 to 4 for each sheet substrate of said set employing at least one additional photomask whereby the exposed substrates are registratable to one another to produce a composite image.

DETAILED DESCRIPTION OF THE INVENTION

Figure 1:
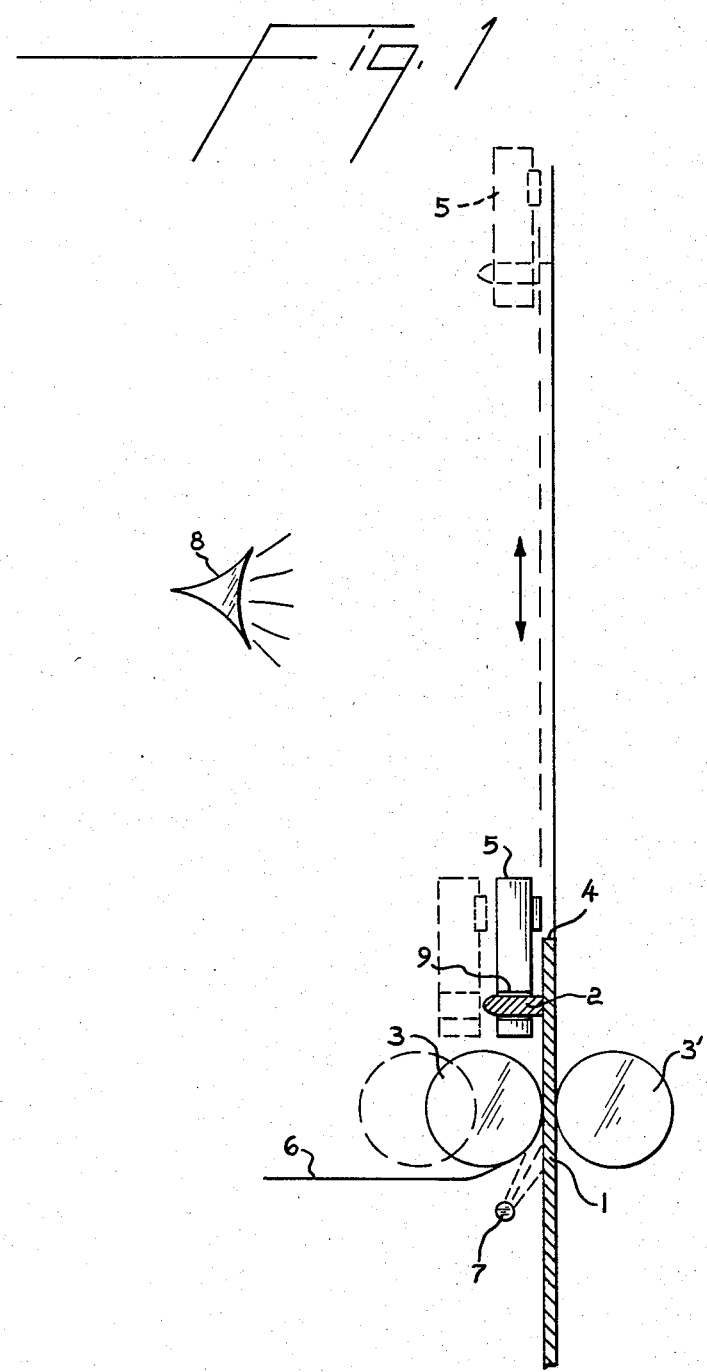
FIG. 1 is a side elevation of an apparatus useful in carrying out the process of the invention in a horizontal plane.

In the process of the invention it is preferred that similar substrates containing a photosensitive layer with or without a top support or cover sheet are introduced into a registration and exposure device so that the imaged elements formed can be combined or used to produce a composite image having excellent registration. Conventionally a different photomask will be employed with each substrate of a set to produce a composite image since the substrates are registerable to one another. The photosensitive layer composition which is not present as a liquid preferably comprises a photosensitive polymer which can be negative or positive working. Conventionally, the substrate is rectangular although this is not a limitation to this process. The registration portion of the apparatus comprises a rectangular film element, preferably flexible, and which is a photomask or phototool. The leading edge of the element can be joined in parallel, hinged relationship on one side of a thin rectangular carrier. The hinged relationship maintains the registration between the photomask and carrier. The apparatus disclosed in concurrently filed application Ser. No. 387,534 filed June 11, 1982 can be employed in the present invention except it is ordinarily necessary to employ a different photomask for each substrate of the set. Also typically only one side of the substrate is exposed.

A substrate containing a photosensitive layer is positioned or aligned adjacent to the photomask so that one substrate edge is in registration contact and approximately parallel to the length of the carrier. In some instances, registration contact can be simple edge to edge contact of the substrate with the carrier wherein the only added criterion is that the image pattern of the photomask is completely contained within the area of the sheet to be imaged. However, registration contact more generally requires the precise alignment of the photosensitive sheet substrate with details of the photomask image or images. In this instance at least two contact points on or in the sheet are brought into a fixed relationship with two corresponding contact points fixed to the carrier. Such points may be notches and tabs suitably spaced on the sheet and carrier edges. Alternatively the points may consist of registration pin and hole combinations wherein the sheet contains precisely located registration holes which are positioned in the desired orientation by registration pins. Since the registration is identical from substrate to substrate in a set, the imaged photosensitive layers can be combined in register and used to produce a composite image.

Once a substrate containing a photosensitive layer is in registration relationship to the carrier, the flexible film photomask is applied to the side of the substrate bearing the photosensitive layer in the presence of a liquid interface by applying normal pressure in a line roughly parallel to the carrier on the outer surface of the photomask at or near the hinged edge and advancing (relatively) the pressure line in the direction perpendicular to the hinge line and parallel to the sensitized substrate surface and, concurrent with the advance, applying the liquid, e.g., by spraying, to the nip between the substrate and the inner surface of the photomask formed by the advancing pressure line. In effect the photomask is temporarily wet laminated to one side of the substrate in register wherein the substrate is separated from the photomask surface by a liquid interface. This lamination process is preferably carried out by passing the hinged photomask-registered sheet assembly through a pair of pressure rollers. In this mode of operation, pressure is applied at or near the leading edge of the sensitized substrate and the flexible photomask. Liquid, preferably water, is then sprayed into the nip formed between the photomask and the substrate. Preferably, the registration apparatus is oriented so that the general direction of the wet lamination is upward, i.e., the substrate travels in an upward direction relative to the pressure rolls and liquid applicators. When so oriented, a cleaning action of the liquid on both the photomask and the photosensitive layer or support or cover sheet can be achieved, which is enhanced by the use of excess liquid directed at both surfaces and which will simply drain into a catching basin carrying any extraneous matter with it. In addition, the area above the pressure rolls where actinic exposure preferably occurs can more easily be kept free of unwanted liquid. This process of obtaining alignment of a substrate and photomask is obtained without the use of vacuum. However, a vacuum could be used to remove excess liquid.

It is understood that in the present specification that "substantially no movement" means that surface of the photosensitive layer and the photomask do not move relative to one another in directions parallel to their surfaces, i.e., the surfaces do not slide relative to one another to change the alignment of the photomask to the substrate. However, it is understood that "substantially no movement" allows relative movement of the photomask and the photosensitive layer in the direction perpendicular to their surfaces to form a more intimate contact, e.g., as liquid is squeezed from the interface between the photosensitive layer and the photomask. However, the photosensitive layer and photomask, already contacted by the advancing pressure line, will remain in a fixed relationship in directions parallel to their surface.

Also it is understood in the present specification that "contacting" through the liquid layer a substrate containing a photosensitive layer and a photomask does not exclude intermediate layers. For example, the photosensitive layer may have a support or cover sheet which allows actinic radiation to pass or the photomask may contain a release coating. Such support or cover sheet or release coating could contact the liquid layer.

In the present specification, a photosensitive layer is employed to mean a preformed layer and excludes a photosensitive layer present as a liquid.

Once the photomask has been fixed in register over the photosensitive layer, the substrate with its photosensitive material may be exposed to any source of actinic radiation. The radiation may emanate from point sources or be in the form of parallel rays or divergent beams. By using a broad radiation source relatively close to the image-bearing transparency, actinic radiation enters as divergent beams and thus irradiates a continually diverging area in the photosensitive layer underneath the clear portions of the transparency. With thick photosensitive layers such as on letterpress or flexographic printing plates, this results in a polymeric relief having its greatest width at the bottom of the photosensitive layer, i.e., a frustum, the top surface of the relief being the dimensions of the clear area (for negative working systems).

Inasmuch as the free-radical generating systems activatable by actinic radiation generally exhibit their maximum sensitivity in the ultraviolet range, the radiation source should furnish an effective amount of this radiation, preferably having a wavelength range of 3000 Å to 4000 Å or above. Suitable sources of such radiation, in addition to sunlight, include carbon arcs, mercury vapor arcs, fluorescent lamps with ultraviolet radiation-emitting phosphors, argon glow lamps, electronic flash units and photographic flood lamps, etc. Of these, the mercury vapor lamps and the fluorescent sun lamps are most suitable.

It is also possible to completely remove the substrate containing the photosensitive layer from the registration device and expose it on any suitable exposure unit. In this instance the photomask and carrier remain fixed in registration with the photosensitive layer by the action of surface or viscous forces induced by the interface liquid. It is understood that both surface and viscous forces may be present.

When imaging exposure is complete, the photomask is peeled from the surface of the exposed photosensitive element thus releasing the imaged element from registration. The imaged element is then transferred from the registration-exposure apparatus and the hinged photomask is replaced by one of the remaining photomasks in the set. The hinged photomask-carrier assembly is then returned to its initial position to receive the next substrate containing the photosensitive layer in the set to be imaged. In a preferred mode of operation, after exposure, the pre-exposure process steps, for the most part, are reversed. Thus the exposed substrate passes back through the pressure means such as rollers and the photomask is pulled back until the hinged area on the carrier is reached. The rollers are moved apart, the photomask carrier is lifted and the photomask is replaced by a another one in the set. Other means than rollers may be used to apply pressure, e.g., a squeegee.

The sheet substrate during the registration and imagewise exposure process may be in any orientation including a horizontal plane or vertical plane. Preferably the substrate will be in a substantially vertical plane. In the process of this invention any means can be used to convey the sensitized substrate to and from the registration position in the apparatus.

The liquid which is applied to the photosensitive layer or support or cover sheet and photomask serves several vital functions in the process of this invention. The liquid serves to uniformly fix the photomask in intimate registered contact to the photosensitive surface or support or cover sheet during actinic exposure and after exposure allows the photomask to be easily removed from the exposed sensitized substrate without damage or transfer of either. The excess liquid serves to clean the surface of the photomask and individually each photosensitive surface or support layer thus preventing deterioration of the photomask image and/or the resulting exposed image, particularly by element born dirt. By spraying liquid on the photomask the environment and temperature of the photomask is maintained constant and less susceptible to changes in ambient temperature or humidity. In this respect, it is also desirable to spray liquid on the exterior surface of the photomask, provided the liquid does not interfere with exposure or is removed therefrom before actinic exposure. The liquid interface should be substantially transparent to actinic radiation and should not damage the photomasks or the photosensitive sheet surface or cover sheet unless surface modification is desired. Neither should it interfere with the exposure of the photosensitive layer. The liquid should preferably wet both surfaces of the photomask and the surface of the photosensitive layer or support or cover sheet, have low volatility at ambient temperatures, and have sufficient viscosity to fulfill the vital functions of the liquid. The preferred liquid is water or aqueous solutions containing adjuvants which improve liquid characteristics, e.g., surface active agents, viscosity adjusting agents, etc. Other liquids, of course, can be used depending on the conditions required, e.g., alcohols, glycols, glycol ethers, halogenated hydrocarbons, paraffins, etc., provided they fullfil the above criteria. In the instance when long exposure times are required with actinic sources which induce buildup of heat, a high boiling point liquid like ethylene glycol is preferred. Since the liquid remains after the exposure step, a photosensitive liquid is not used for this component of the process.

The process of this invention is useful for imaging any substrate containing a photosensitive layer which is compatible with the liquid treatment. If the photosensitive composition is not compatible with the liquid, preferably a support or cover sheet then will be used to protect this composition. The process is particularly useful for exposing elements typically used for producing lithographic printing plates or any other thin stencil mask image.

The registration and imagewise exposure process of the present invention is applicable to a wide variety of sheet substrates provided at least one surface contains a photosensitive layer which may have an optional support or cover sheet.

Some elements useful in preparing printing plates are provided with auxiliary cover layers to protect the photomask and prevent it from adhering to the tacky photopolymer layer, or particle-containing, oxygen-barrier overcoat mat layers which are used to achieve faster vacuum drawdown during the conventional exposure step. Using the process of the invention, slip and overcoat layers can be present or with cover sheets provided with a release coating, such as, silicone treated polyethylene terephthalate, which can be peeled off prior to exposure can be used. The elimination of these layers can reduce manufacturing costs for these photopolymerizable elements.

In practicing the invention, a sheet substrate bearing photosensitive compositions of various types, e.g., negative or positive working, may be used. Photopolymerizable elements useful in making lithographic printing plates are disclosed in U.S. Pat. Nos. 3,458,311, 4,293,635, 4,072,528 and 4,072,527. Elements useful in preparing litho films are disclosed in U.S. Pat. No. 4,229,517. Photosensitive compositions useful in making flexographic printing plates are disclosed in U.S. Pat. Nos. 4,323,637, 4,177,074, and 4,229,520 filed 2/25/81. Photosensitive elements useful in preparing an overlay print are disclosed in U.S. Pat. No. 4,229,520 filed 12/31/79 and U.S. Pat. No. 4,282,308. These patents and applications are incorporated herein by reference.

FIG. 1 is a pictorial representation of an apparatus useful in carrying out the process of the invention. This process will now be described with reference to this apparatus. In this process, a set of similar substrates with a photosensitive layer and their corresponding set of photomasks are aligned and punched along one edge using a commercially available punch. One prepunched sensitized substrate designated as (1) is taken, and the holes in its leading edge are fitted over the corresponding pins in pin registration set (2). The punched photomask (6) is then affixed in a parallel, hinged relationship to photomask carrier (5) the prepunched holes in the photomask (6) corresponding to the registration pin receiving hole (9) in carrier (5). The photomask carrier (5) is then lowered and registered to substrate (1) using pin registration set (2). (Alternatively a photomask with holes can fit on the same pins as the substrate). Stop pins (4) are retracted and nip rolls (3) and (3') are then activated bringing upper roll (3') in contact with lower roll (3) thus forming a nip between the substrate (1) and photomask (6). Since FIG. 1 is only a side view, only one pin in the registration pin set and one hole is shown. In reality, two or more holes are present in the photomask carrier and a like number of pins in the registration pin set are provided. Liquid spray (7) is turned on so liquid is sprayed at the nip formed between the photomask (6) and the substrate (1). The substrate (1) in register with photomask (6) is then moved to the exposure position (5'), and exposed using exposure unit (8). Intimate contact is achieved prior to exposure by squeezing out the excess liquid between substrate (1) and photomask (6) with the aid of nip rolls (3) and (3'). After exposure the mechanism is reversed. Substrate (1) in register with photomask (6) is moved back, nip rolls (3) and (3') are moved apart, photomask carrier (5) is lifted so it is out of contact with the pins in registration pin set (2) and the exposed substrate (1) and photomask (6) are released. Similar prepunched sheet substrates can then be registered and exposed using a remaining photomask of the set, and the steps described above, whereby a set of imaged elements are formed which can be combined in register or used to produce a composite image.

Figure 2:
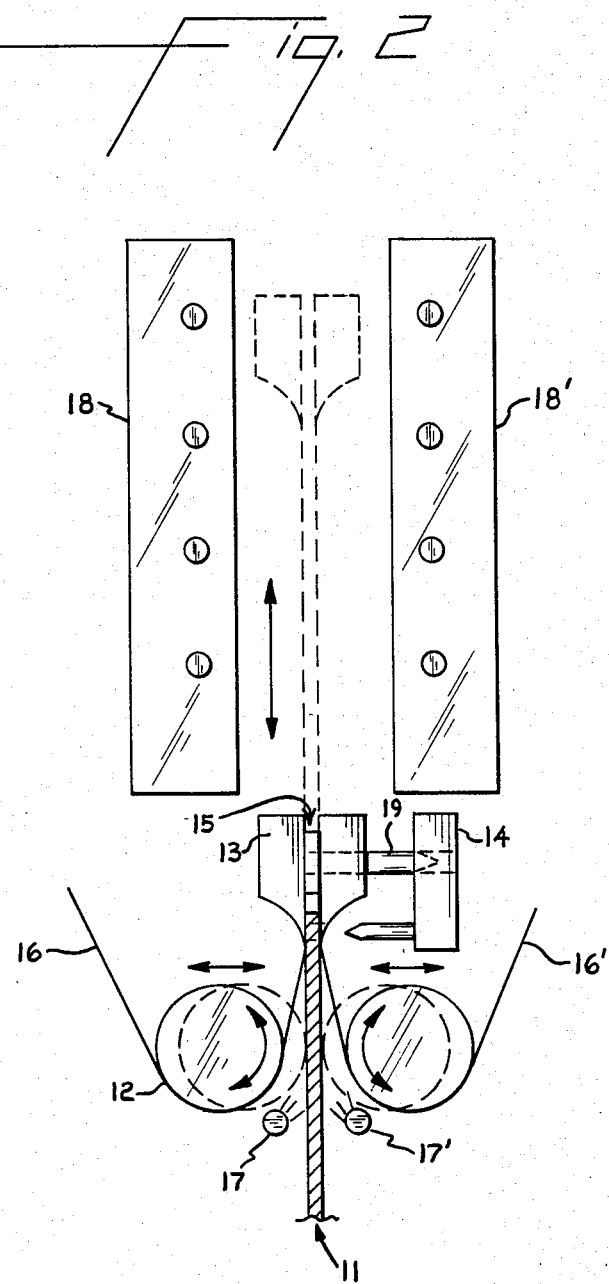
FIG. 2 is a side elevation of an apparatus useful in carrying out the process of the invention in a vertical plane.

In FIG. 2, is shown a registration and imagewise exposure process in a vertical mode. The apparatus is particularly adapted to expose both sides of a substrate but in the present case only one side is exposed. The substrate (11) contains at least two pin register holes along its leading edge. Before a substrate (11) is introduced, the following conditions are established:

Nip rolls (12 and 12') are open;
Clamp (13) is open;
Photomask assembly (15) which contains a photomask (16) and a flexible sheet material (16') and its carrier is registered to clamp (13) by carrier register pins (19) with the photomask and flexible sheet kept taut around nip rolls (12 and 12');
Pin register bar (14) is not engaged;
Liquid spray (17 and 17') is on; and
Exposure sources (18 and 18') is on standby. Substrate (11) with the sensitized side facing Exposure source (18) is then lifted up to register position inside clamps (13) through nip rolls (12 and 12'). Pin register bar (14) closes; first engaging carrier register pins (19) on clamp (13) and then picking up preformed register holes (10) on substrate (11) with its own pins. Registration of substrate (11) to photomasks assembly (15) is achieved when the pins are engaged. Next clamp (13) is closed to maintain registration and pin register bar (14) is subsequently retracted. Clamp (13) is moved down, carrying photomask assembly (15) and substrate (11) to nip rolls (12 and 12'). Then nip rolls are closed and clamp (13) is moved up to exposure position (18). Intimate contact of photomasks (16) and flexible sheet (16') and substrate (11) is achieved by squeezing out excess liquid with nip rolls (12 and 12'). Exposure on one side is made. After the exposure, the mechanism is reversed, clamp (13) moves down to its initial registered position and then both it and nip rolls (12 and 12') are opened. The exposed substrate (11) is released to allow repetition of the process except a new substrate and new photomask is used.

In a particular instance where both the substrate support and the flexible sheet (16') are transparent to actinic radiation, e.g., transparent polymeric films, the photosensitive layer of the substrate can be uniformly exposed through the support to exposure source (18') either prior to, concurrent with, or after the imaging exposure with exposure source (18) so as to modify the imaged substrate.

Such modification may be conditioning exposure as disclosed in U.S. Pat. No. 3,144,331; an exposure to form a uniformly polymerized stratum as described in Example 4; a uniform exposure which is an integral step of a two exposure imaging process such as disclosed in U.S. Pat. Nos. 4,269,933 and 4,162,162; etc., the above patents being incorporated herein by reference.

The invention is illustrated but is not intended to be limited to the following examples. All parts are by weight unless otherwise indicated.

EXAMPLE 1

Eight coated photopolymerizable elements comprising a 0.012 inch (0.305 mm) aluminum support, a 0.00015 inch (0.004 mm) photopolymerizable layer and a 0.00005 inch (0.0013 mm) polyvinyl alcohol (PVA) containing overcoat are prepared. The photopolymerizable layer has the following composition:

| Ingredient | % Dry Wt. |
| --- | --- |
| Methylmethacrylate/methacrylic acid (90/10) mol. wt. of 20,000 | 58.5 |
| Trimethylol propane triacrylate | 20.4 |
| Triethylene glycol dicaprate and triethylene glycol dicaprylate | 8.0 |
| Benzophenone | 8.0 |
| 2,2'-Bis(2-chlorophenyl)-4,4',5,5'-tetraphenyl biimidazole | 3.4 |
| 4,4'-Bis(dimethylamino)benzophenone (Michler's ketone) | 0.8 |
| 4,4',4"methylidynetris (N,N—dimethyl aniline) | 0.8 |
| Victor Green Pigment (C.I. Pigment Green 18) | 0.1 |

The PVA containing layer has the following composition:

| Ingredient | % Dry Wt. |
| --- | --- |
| Poly(vinyl alcohol) 13% solution | 88.2 |
| Poly(vinyl pyrrolidone (70)/vinyl acetate (30)) copolymer | 10.8 |
| 10% Solution of octyl phenoxy polyethoxy ethanol, dispersing agent | 1.0 |

Four of the elements are punched in register with the set of photomasks to be used during exposure using a commercially available punch. Each punched element is registered to and exposed through one photomask in the set using the process of the invention described earlier. The liquid sprayed into the nip formed between the photomask and the photopolymerizable element is Nujol ® (mineral oil) manufactured by Plough Sales Corp., Memphis, TN. The elements are exposed for approximately 15 seconds using a 4 KW Xenon lamp at a distance of 24 inches (60.96 cms).

Each of the remaining four photopolymerizable elements are aligned to one of the photomasks in the set, drawn down for 2 minutes in an exposure vacuum frame, and exposed for 15 seconds using the light source described above. These four elements serve as a control.

The exposed elements are then developed in an Enco Processor Model No. N-322 manufactured by Azoplate Corp., Morristown, NJ using the following developer:

| | |
| --- | --- |
| Sodium carbonate | 1.92% |
| Butyl carbitol | 11.74% |
| Water | 86.34% |
| pH 11.5 ± 0.2 | |

The developed elements are finished in a sodium pyrophosphate finisher and are dried in hot air to give eight lithographic printing plates. One set of four lithographic printing plates are prepared using the registration and exposure process of the invention, and the other set of four serves as the control. Each of the four plates in the set corresponds to one of the four colors to be printed.

The plates are mounted on a 4 color Miehle 49 FC Printing Press, Series 428, manufactured by the Miehle Company, a division of Miehle-Goss-Dexter, Chicago, IL. The registration pins on the plate cylinder are 30 inches (76.2 cms) apart (15 inches (38.1) from the center). The plates are dampened using the Miehle Matic dampening system which comprises a 2 roll metering system using a 20% alcohol/water ratio, 12 oz. of red etch which is a solution of magnesium nitrate, ammonium dichromate, phosphoric acid diluted with water to a pH on press of 3.8 and 4 ozs. of gun/gallon.

The inks for use in the printing operation are Crowe Inks manufactured by Crowe Corp., Philadelphia, PA having an Inkometer reading of uniform #14 tack, and are listed below in the sequence in which they are printed:
Yellow Ink: Series I 1/D PC Yellow
Blank Ink: Series II 2/D PC Black
Magenta Ink: Series II PC Magenta
Cyan Ink: Series I PC Cyan The plates corresponding to each color identified above are pin registered and mounted on the plate cylinder, and the four-color image is printed on paper. Using the process of the invention excellent registration of the four-color image on the print is obtained.

EXAMPLE 2

Example 1 is repeated with the following exceptions:
o The polyvinyl alcohol containing overcoat is replaced by a 0.0005 inch (0.00127 cm) thick polyethylene terephthalate cover sheet which is peeled off prior to exposure.
o Liquid sprayed into the nip formed between the photomask and laminated photopolymerizable element is water.

Using the process of the invention, the overcoat layer can be eliminated because the vacuum drawdown required during conventional exposure is not needed.

EXAMPLE 3

Four laminated elements are prepared by Steps I, II and III in Example 1 of U.S. Pat. No. 4,282,308. These laminated elements and four halftone color separation negatives (one for each color) are aligned and holes punched along one edge using a commercially available Kodak ® Register punch. The punched elements are then registered and exposed on the apparatus shown in FIG. 1 using the process of the invention described earlier. The liquid sprayed into the nip formed between the laminated element and the halftone color separation negative is water. The exposure device is a carbon arc (E—1C constant arc—140 amp, No. 1112—Ld 612 MacBeth Arc Lamp Co., Philadelphia, PA. Each element is exposed in register with the halftone color separation negative for 15 seconds at 56 inches (142.24 cms) from the lamp. Five minutes after exposure, the elements are delaminated and toned as described in Example 1 of U.S. Pat. No. 4,282,308. The toned elements are then assembled in register to give an excellent quality negative color proof of the overlay type.

EXAMPLE 4

Eight laminated photosensitive elements are prepared as described in Example 8 of U.S. Ser. No. 237,861 filed Feb. 25, 1981, abandoned. These elements comprise in order, a support, an adhesive layer, a photosensitive layer, a polyamide layer and a cover sheet.

These elements are then placed support side up in a Cyrel ® 3040 Exposure Unit (registered trademark of E. I. du Pont de Nemours and Company, Wilmington, DE) fitted with Sylvania BL-VHO fluorescent lamps, and are given an overall exposure in air at atmospheric pressure about 3 minutes through the support to polymerize a predetermined thickness of the photopolymerizable layer adjacent the adhered support. The elements are then aligned to the photomasks to be used in the next exposure step, and punched along one edge using a commercially available punch. The holes are punched relative to the location of the pins, in the registration pin set shown in FIG. 1.

The cover sheets on four of the punched elements are removed leaving the polyamide layer adhered to the photopolymerizable layer, and these elements are registered to and exposed through the photomasks (negatives) using the process of the invention described earlier. The elements are exposed for 5 minutes to Sylvania BL-VHO fluorescent lamps at a distance of 2 inches. The liquid sprayed into the nip formed by the element and photomask is water.

The exposed elements are then developed, dried, and post exposed as described in Example 8 of U.S. Ser. No. 237,861 filed Feb. 25, 1981 to give four printing plates corresponding to the four colors to be printed.

Prior to the post-exposure step, each dry printing plate is immersed for 2 minutes in an aqueous solution of potassium bromate-potassium bromide having a solution pH of 1.2. The bromide solution is prepared as follows: to 1800 mls of tap water is added 20 ml of conc. hydrochloric acid with mixing. To this solution is added with mixing a mixture of 200 ml tap water, 10 g potassium bromide and 2.8 g potassium bromate (90.56% $H_2O$/8.81% HCl/0.49% KBr and 0.14~ $KBrO_3$). The free bromine concentration is 0.4%.

The cover sheets on the remaining four punched elements are removed and the elements are exposed, developed, dried and post exposed as described in Example 1 of U.S. Ser. No. 237.861 filed Feb. 25, 1981 to give four additional printing plates which serve as a control. Prior to the post-exposure step these plates (control) are bromine treated as described above.

The printing plates are mounted in color register on plate cylinders with commercially available double sided adhesive tape using the apparatus described in U.S. Ser. No. 15,934 filed Feb. 28, 1979, U.S. Pat. No. 4,446,625, and printed with standard flexographic inks.

A four-color print is made using the plates which are registered and exposed according to the process of the invention to show the four colors in register. The printing plates using the conventional exposure process have to be manually registered while they are being mounted, and the mounting step takes much longer than that for the plates which are prepared using the process of the invention. Further, using the process of the invention no vacuum draw down is required.

Using the two sided exposure apparatus depicted in FIG. 2, the initial 3 minute uniform preexposure through the support can be accomplished with exposure source (18'), e.g., with Sylvania BL-VHO fluorescent lamps, just prior to imaging exposure with exposure source (18).

EXAMPLE 5

Eight flexographic printing plates are prepared as in Example 4 with one exception: the polyamide layer present between the photosensitive layer and the cover sheet in the laminated photosensitive elements prepared is eliminated, and a silicone treated cover sheet is used.

The results can show that after registration and exposure using the process of the invention the photomask does not adhere to the tacky photopolymer layer because of the presence of a layer of water between them. However, using the conventional exposure step where the photomask is placed in contact with the photopolymerizable layer, on separation after exposure, the photomask can stick to the tacky photopolymer layer and is ruined. This example shows the polyamide layer (slip layer) can be eliminated when using the registration and exposure process of the invention thereby reducing the costs for manufacturing the laminated photosensitive elements.

EXAMPLE 6

Four coating solutions are prepared, each containing the following ingredients:

| Ingredient | Amount (g) |
|---|---|
| Methylene chloride solvent | 81 |
| Methanol solvent | 4 |
| 2,2'-Bis(2-chlorophenyl)-4,4',5,5'-tetraphenyl biimidazole | 1.0 |
| 4,4'-Bis(dimethylamino) benzophenone (Michler's ketone) | 0.1 |
| Terpolymer formed from 56% ethyl acrylate, 37% methyl methacrylate and 7% acrylic acid, mol. wt. ca. 260,000, acid number 76-85 | 4.1 |
| 1:1 copolymer of styrene and maleic anhydride, partially esterified with isopropyl alcohol, mol. wt. ca. 1700, acid number ca. 270 | 6.6 |
| Triethylene glycol dimethacrylate | 3.2 |
| Nonionic fluorocarbon surfactant FC-430, Minnesota Mining and Mfg. Corp., 10% solution in $CH_2Cl_2$ | 0.04 |
| Ultraviolet Absorber (2,2'-dihydroxy-4-methoxybenzophenone) | 1.0 |

To each individual solution is also added one of the following dyes:

| Ingredient | Amount (g) |
|---|---|
| Grasol ® Fast Brill. Red RI (C.I. Solvent Red 96) | 1.0 |
| Irgacet ® Yellow 2RL (C.I. Solvent Yellow 91) | 1.0 |
| Irgacet ® Brill. Blue 2GLN (C.I. Solvent Blue 48) | 1.0 |
| Luxol ® Fast Black L (C.I. Solvent Black 17) | 1.0 |

Each of the above four solutions is coated via a "doctor" knife on a 0.004 inch (0.101 mm) thick polyethylene terephthalate film support having a 0.0002 inch (0.0051 mm) thick soluble substratum which is a modification of that disclosed in Rawlins, U.S. Pat. No. 3,443,9501.

This modification adds two acid terpolymers in a weight ratio of approximately 12:8.01:1, (Rawlins sub:-first polymer:second polyer) wherein the first polymer is formed from ethyl acrylate (56%), methylmethacrylate (37%) and acrylic acid (7%), and the second polymer is formed from 66% methylmethacrylate, 29% ethyl acrylate, and 5% methacrylic acid, to the substratum described in the above cited patent. After hot air drying, the dried coating weights are approximately 0.0004 inch (0.01 mm). Each photopolymerizable layer is then overcoated with a thin oxygen barrier polymer, substantially as described below.

500 g of polyvinyl alcohol (98–98.8% saponified, low viscosity) are added to 5000 g of distilled water and heated at 85° C. for 2 hours. 100 g Of the solution are mixed with 262 g distilled, water, 18 g polyoxyethylene surfactant (10% aqueous solution), 10 g ethyl cellosolve, and 10 g ethyl alcohol. To 100 g of the above mixture are added 2.7 g of a 30% colloidal silica dispersion containing particle sizes in the range of 12 to 15 millimicrons and 30 g of distilled water. This results in an overcoat formulation in grams as follows:

polyvinyl alcohol: 2.25
distilled water: 122.50
polyoxyethylene surfactant: 0.45
ethyl cellosolve: 2.50
ethyl alcohol: 2.50
colloidal silica: 2.70

Using a 2-mil (0.05 mm) doctor knife, the above overcoat solution is coated directly on the photopolymerizable surface and allowed to dry. The coating weight of the overcoat is 10.0 mg/dm$^2$.

Each of the colored elements is then registered to and exposed through a halftone separation negative (one for each color) using the process of the invention described earlier. The liquid sprayed into the nip formed between the halftone separation negative (photomask) and the colored element is Nujol ® which is a mineral oil manufactured by Plough Sales Corp., Memphis, TN. Each element is exposed to a 4 KW Xenon arc lamp for 90 seconds. Each exposed element is then developed for 15 seconds with an aqueous solution (pH 10.4) of potassium carbonate (1.5%) and potassium bicarbonate (1.5%) at 29° C., followed by rinsing in warm water (38° C.), and drying, to give a faithful image of the halftone targets, one in magenta, one in yellow, one in cyan, and one in black.

The four elements are then assembled in register to give an excellent quality color proof of the overlay type.

EXAMPLE 7

Example 6 is repeated with two exceptions: (1) the elements used do not have an overcoat, and (2) the liquid is sprayed into the nip formed between the halftone separation negative (photomask) and element during the registration and exposure process is water.

The exposed, developed, rinsed and dried elements are placed in register to give an excellent quality color proof of the overlay type. This example is to show that using the process of the invention the overcoat layer, which is required to achieve draw down in the conventional exposure process, can be eliminated.

EXAMPLE 8

Four photopolymerizable elements are prepared as in Example 1 of U.S. Pat. No. 3,582,327 with one exception: coating wt. of photopolymerizable composition is 80 mg/dm$^2$. Each element is registered to and exposed through one process transparency in the set of four (one for each color) using the process of the invention described earlier. The liquid used in the process is water, and the exposure source, a 4 KW Xenon lamp. Each element is exposed for 20 seconds at a distance of 24 inches (60.96 cm). The polyethylene terephthalate cover sheet on each element is then stripped off and the imagewise exposed photopolymerizable layers are respectively toned with yellow, magenta, cyan and black toners. The yellow toned element is placed in contact with glossy paper laminated between a hot roll and hot platen at 115° C. at a pressure of 1.5 lbs per linear inch and stripped while hot at a rate of 0.2" per second. The next toned image transferred is magenta, followed by cyan and then black using the same transfer process described earlier with regard to the yellow image. The paper support is provided with registration holes corresponding to those on the photopolymerized elements and a registration pin set similar to that disclosed in FIG. 1 is used to assure registration of the transferred toned images. Toners used are those disclosed in Example 1 of U.S. Pat. No. 3,649,268.

The four-color print so formed is to show the four colors in excellent register.

We claim:

1. A process of registering and imagewise exposing to actinic radiation a set of sheet substrates registratable to one another to produce a composite image, each substrate containing a photosensitive layer comprising the steps of:
    (1) advancing a substrate to a position in a device to undertake in either order or concurrently
        (a) aligning the substrate and a photomask in a predetermined relationship to one another through a hinged relationship of the photomask and the substrate to permit substantially identical alignment of a photomask and each similar sheet substrate of the sequence;
        (b) applying a liquid between the photosensitive layer and the photomask;
    (2) contacting through the liquid the substrate containing the photosensitive layer and the photomask wherein liquid between the photosensitive layer and the photomask is displaced when the substrate and photomask are brought into more intimate contact by an advancing pressure line whereby during said contacting substantially no movement of the photosensitive layer relative to the photomask occurs other than a more intimate contact due to displacement of the liquid from a liquid layer and whereby at least one of a set of interfacial or viscous forces due to the liquid layer aids to maintain the photosensitive layer and photomask in a fixed position relative to one another;
    (3) exposing the photosensitive layer to actinic radiation through the photomask;
    (4) removing the photomask from the exposed photosensitive layer and removing the exposed substrate from the device;
    (5) repeating steps 1 to 4 for each sheet substrate of said set employing at least one additional photomask whereby the exposed substrates are registratable to one another to produce a composite image.

2. The process of claim 1 wherein said advancing pressure line employs a nip.

3. The process of claim 1 wherein the application of liquid is to a substrate surface held in a substantially vertical plane.

4. The process of claim 1 wherein steps 1 to 4 are with the substrate surface held in a substantially vertical plane.

5. The process of claim 1 with the substrate held in a substantially vertical plane.

6. The process of claim 1 wherein the photosensitive layer is positive working.

7. The process of claim 1 wherein the photosensitive layer is negative working.

8. The process of claim 1 wherein the photosensitive layer contains a photohardenable component.

9. The process of claim 1 wherein the photosensitive layer contains a photohardenable addition polymerizable component.

10. The process of claim 8 wherein the photohardenable component is photocrosslinkable or photodimerizable.

11. The process of claim 1 wherein the photomask is flexible.

12. The process of claim 1 wherein the surface of the photosensitive layer directly contacts the photomask through the liquid.

13. The process of claim 1 wherein the photosensitive layer is separated from the liquid layer by a cover sheet or layer which allows actinic radiation to pass.

14. The process of claim 1 wherein the liquid comprises water.

15. The process of claim 1 wherein the substrate is transparent to actinic radiation and the photosensitive layer is uniformly exposed through the substrate to a second source of actinic radiation prior to, concurrent with, or after the exposure of step (3).

16. The process of claim 1 wherein in step (2) registration contact is made by precise alignment of details contained on the substrate containing the photosensitive layer or substrate carrier with details of the photomask.

17. The process of claim 1 wherein the step (1) (b) an excess of liquid is provided compared to the amount used to separate the substrate containing the photosensitive layer and the photomask in the subsequent operation of step (2) and in step (2) a cleaning action is achieved on both the photosensitive layer and the photomask by use of excess liquid.

18. The process of claim 17 wherein in step (1) (b) an excess of liquid is provided compared to the amount used to separate the substrate containing the photosensitive layer and the photomask in the subsequent operation of step (2) and in step (2) a cleaning action is achieved on both the photosensitive layer and the photomask by use of excess liquid.

* * * * *